United States Patent
Goggin et al.

(10) Patent No.: US 11,176,962 B1
(45) Date of Patent: Nov. 16, 2021

(54) HEAT-ASSISTED MAGNETIC RECORDING LASER WITH A CURVED FACET

(71) Applicant: Seagate Technology LLC, Fremont, CA (US)

(72) Inventors: Aidan Dominic Goggin, Donegal (IE); Reyad Mehfuz, Londonderry (GB); John Moloney, Castleconnell (IE)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/017,167

(22) Filed: Sep. 10, 2020

(51) Int. Cl.
| | |
|---|---|
| *G11B 11/105* | (2006.01) |
| *G11B 5/48* | (2006.01) |
| *H01S 5/10* | (2021.01) |
| *G11B 5/00* | (2006.01) |
| *G11B 5/60* | (2006.01) |

(52) U.S. Cl.
CPC .......... *G11B 5/4866* (2013.01); *H01S 5/1082* (2013.01); *G11B 5/6088* (2013.01); *G11B 2005/0021* (2013.01)

(58) Field of Classification Search
None
See application file for complete search history.

(56) References Cited

U.S. PATENT DOCUMENTS

| | | | |
|---|---|---|---|
| 4,739,508 A | 4/1988 | Clark | |
| 4,780,879 A * | 10/1988 | Chinone | H01S 5/1082 372/108 |
| 4,955,034 A | 9/1990 | Scerbak | |
| 5,084,895 A * | 1/1992 | Shimada | G02B 6/42 257/E33.067 |
| 5,495,492 A * | 2/1996 | Toda | H01S 5/1082 372/44.01 |
| 6,674,941 B2 * | 1/2004 | Tatum | G02B 6/4204 385/27 |
| 8,456,969 B1 * | 6/2013 | Mooney | G11B 5/314 369/13.33 |
| 2003/0026317 A1 * | 2/2003 | Behfar | H01S 5/1071 372/94 |
| 2015/0131415 A1 * | 5/2015 | Peng | G02B 6/1226 369/13.32 |
| 2015/0213819 A1 * | 7/2015 | Gokemeijer | G11B 5/4866 369/13.13 |
| 2017/0092309 A1 * | 3/2017 | Goulakov | G11B 5/3133 |
| 2017/0170629 A1 * | 6/2017 | Lerner | H01S 5/02326 |
| 2019/0148911 A1 | 5/2019 | Lin et al. | |

* cited by examiner

*Primary Examiner* — Tan X Dinh
(74) *Attorney, Agent, or Firm* — Mueting Raasch Group

(57) ABSTRACT

A heat-assisted magnetic recording head includes a slider body having a waveguide that delivers light to a near-field transducer. The waveguide is optically coupled to an input coupler a of the slider body that receives the light. A laser diode is mounted on or in the slider body. The laser diode has an integral exit facet proximate the input coupler. The exit facet has a curved profile that modifies a shape of the light emitted from the exit facet into the input coupler.

20 Claims, 10 Drawing Sheets

HEAT-ASSISTED MAGNETIC RECORDING LASER WITH A CURVED FACET

SUMMARY

Embodiments described herein include a heat-assisted magnetic recording laser with a curved facet. In one embodiment, a heat-assisted magnetic recording head includes a slider body having a waveguide that delivers light to a near-field transducer. The waveguide is optically coupled to an input coupler of the slider body that receives the light. The laser diode is mounted on or in the slider body and has an integral exit facet proximate the input coupler. The exit facet has a curved profile that modifies a shape of the light emitted from the exit facet into the input coupler.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1A:
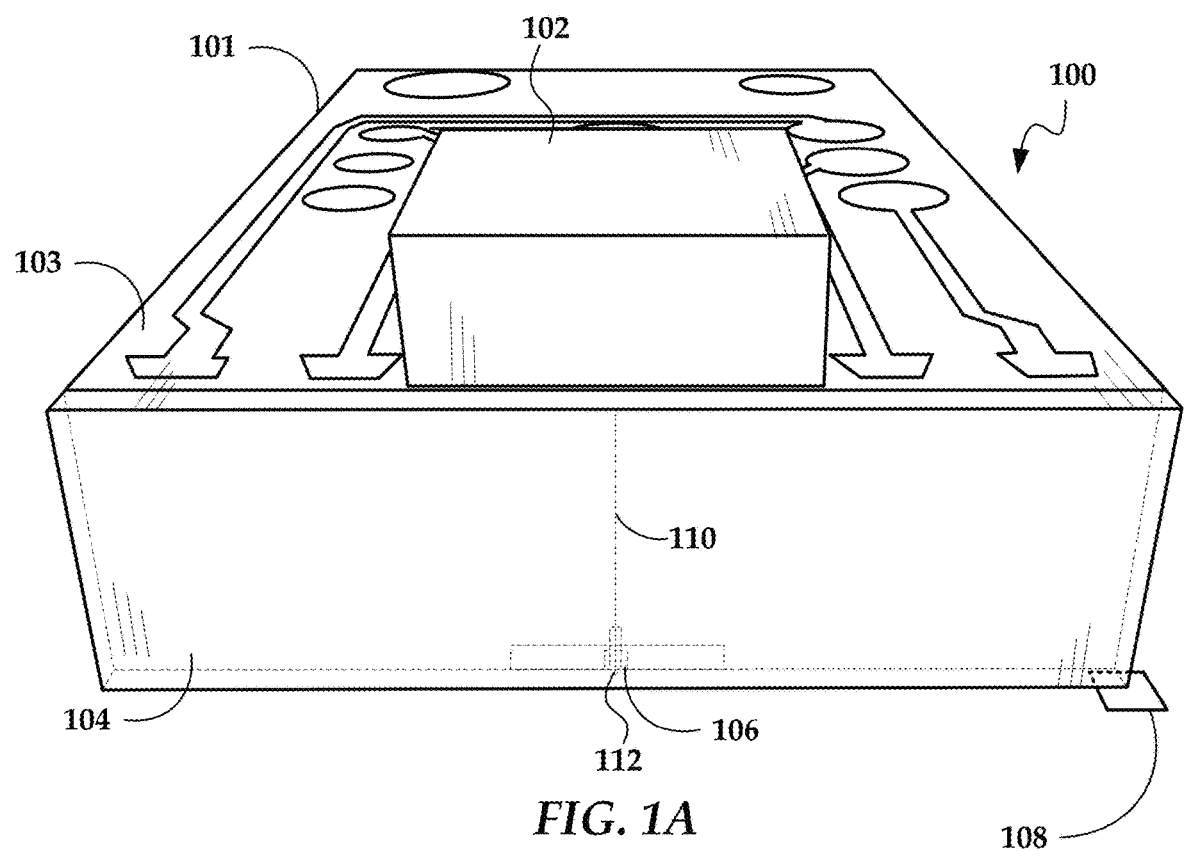
FIGS. 1A and 1B are perspective views of a slider assembly according to example embodiments.

The present disclosure generally relates to data storage devices that utilize a magnetic recording medium, e.g., magnetic disks. For example, a hard disk drive (HDD) unit contains one or more magnetic disks that are written to and read from using a magnetic read/write head attached to the end of an arm that is positioned over tracks in the disk. To record data, the read/write head generates magnetic fields using a magnetic coil, the fields being directed to the magnetic disk surface via a write pole. To read data, the read/write head senses changes in magnetic field via a sensor such as a magneto-resistive stack that is held proximate to the moving disk. A disk drive typically has multiple heads, one for each disk surface.

In order to increase ADC in magnetic storage, some drives utilize a technology known as heat-assisted magnetic recording (HAMR). In reference to FIG. 1A, a perspective view shows a HAMR write head 100 according to an example embodiment. The write head 100 includes a laser diode 102 located on input surface 103 of a slider body 101. In this example, the input surface 103 is a top surface, which is located opposite to a media-facing surface 108 that is positioned over a surface of a recording media (not shown) during device operation. The media-facing surface 108 faces and is held proximate to the moving media surface while reading and writing to the media. The media-facing surface 108 may be configured as an air-bearing surface (ABS) that maintains separation from the media surface via a thin layer of air.

The laser diode 102 delivers light to a region proximate a HAMR read/write transducer 106, which is located near the media-facing surface 108. The energy is used to heat the recording media as it passes by the read/write transducer 106. Optical coupling components, such as a waveguide system 110, are formed integrally within the slider body 101 (near a trailing edge surface 104 in this example) and function as an optical path that delivers energy from the laser diode 102 to the recording media via a near-field transducer 112. The near-field transducer 112 is located near the read/write transducer 106 and causes heating of the media during recording operations. The near-field transducer 112 may be made from plasmonic materials such as gold, silver, copper, etc.

The laser diode 102 in this example may be configured as either an edge-emitting laser or surface-emitting laser. Generally, the edge-emitting laser, also called in-plane laser, emits light along the wafer surface of a semiconductor chip and a surface emitting laser emits light in a direction perpendicular to a semiconductor wafer surface. An edge-emitting laser may be mounted on the top surface 103 of the slider body 101 (e.g., in a pocket or cavity) such that the light is emitted in a direction perpendicular to the media-facing surface (along the negative y-direction in this view).

Figure 1B:
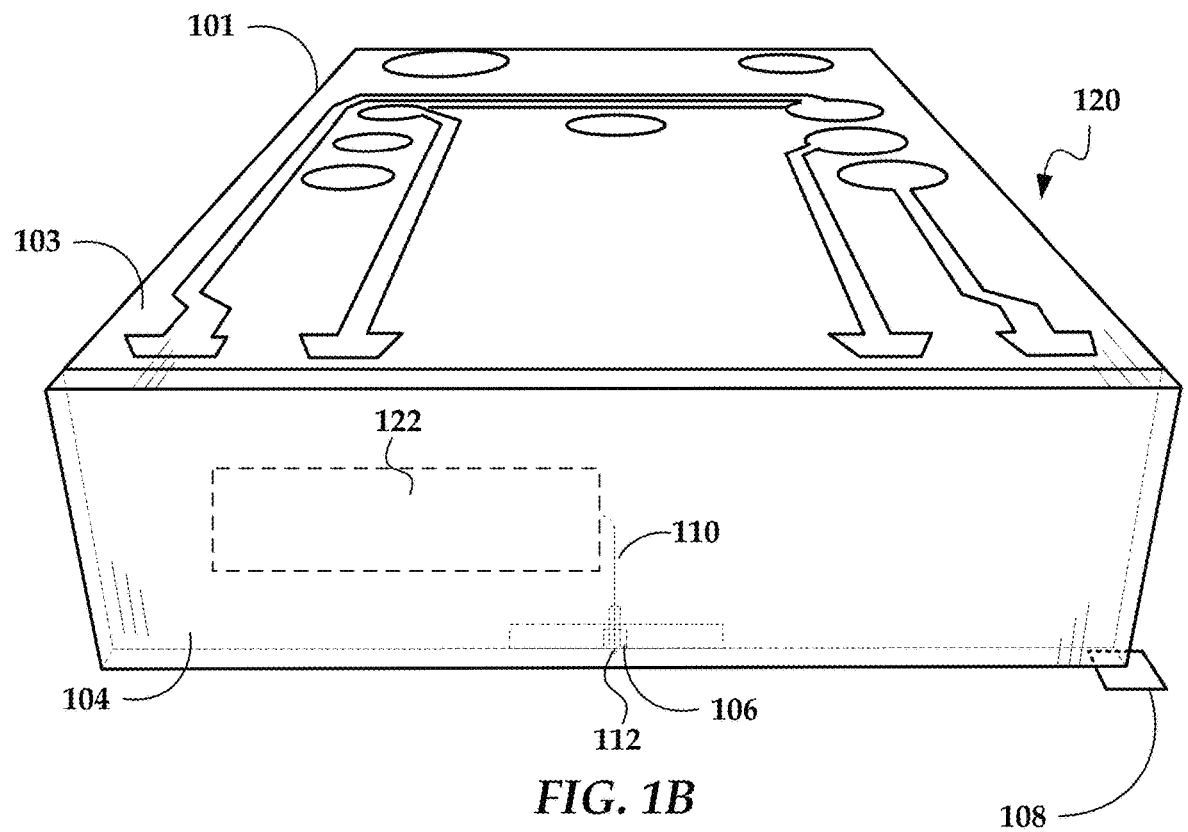

In the present disclosure, hard drive recording heads may use a different type of laser than what is shown in FIG. 1A. A read/write head 120 using this alternate approach is shown in FIG. 1B, wherein components are given the same reference numbers as analogous components in FIG. 1A. At least part of a semiconductor laser 122 or material to form a laser (e.g., epitaxial layer) is not self-supporting (e.g., not a separately packaged device) but is physically transferred to a target read/write head substrate that does contain already or will contain, after further processing, the other components of the read/write head (e.g., write coil and poles, reader stack) without the use of a separate or intermediate support during attachment. Carrying the semiconductor laser 122 with the read/write head substrate, without a separate or intermediate support substrate, can help to reduce the size and simplify the shape and connection methods, and it can also allow for the use of laser geometries and designs that are very different from simple edge-emitting cleaved facet lasers that have been proposed in the past.

In at least some cases, parts of the laser 122 (e.g., GaAs active region) are incompatible with epitaxial growth on the target substrate of a slider, which may be formed of a dielectric such as alumina. As such, the laser 122 cannot be formed using the same layer deposition processes used to form the magnetic and optical components that are integrated into the head. In embodiments described below, the laser may instead be formed on the substrate by transfer printing a thin, non-self-supporting crystalline layer (epitaxial layer), or a stack of such layers, from a growth substrate on which they were formed to a target substrate. Thereafter, the epitaxial layer and substrate are further processed (e.g., masked etched, further layers added) to form the integrated laser diode unit 122. This process of transferring non-self-supporting layers of epitaxial-growth-incompatible layers is referred to herein as On-Wafer Laser (OWL) process integration. This process may also be referred to as transfer printing, dry transfer printing, nanoprinting, etc. Embodiments described herein may be implemented in an OWL system.

The waveguide system 110 discussed herein and shown in FIGS. 1A and 1B may be applicable to any type of light delivery configuration. For example, a laser may be mounted on the trailing edge surface 104 instead of the top surface 103. In another configuration known as free-space light delivery, a laser may be mounted external to the write head 100 and coupled to the slider by way of optic fiber and/or waveguide. An input surface of the slider body 101 may include a grating or other coupling feature to receive light from the laser via the optic fiber and/or waveguide.

Figure 2:
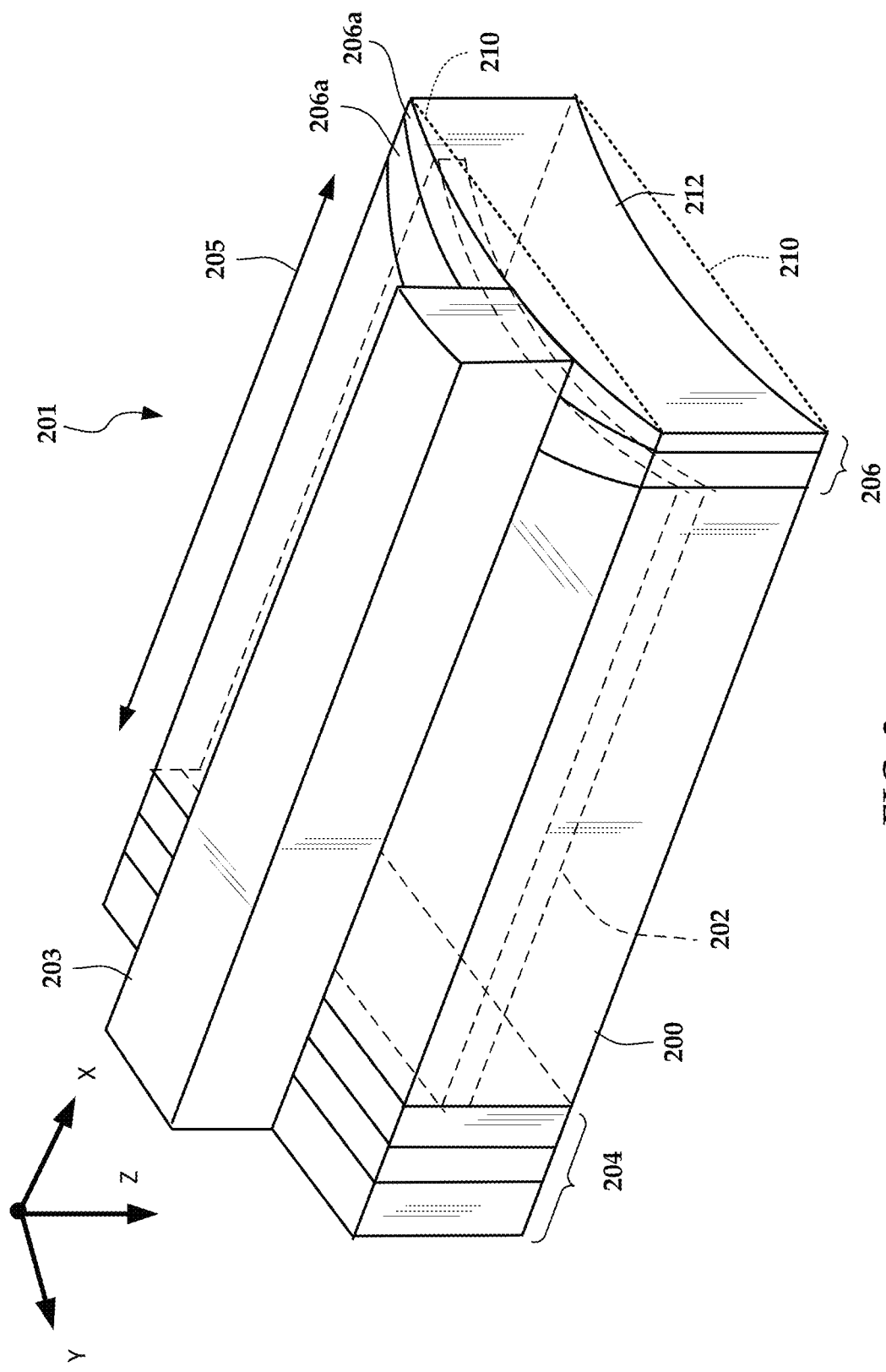
FIG. 2 is a perspective view of a laser diode according to an example embodiment.
Figure 3:
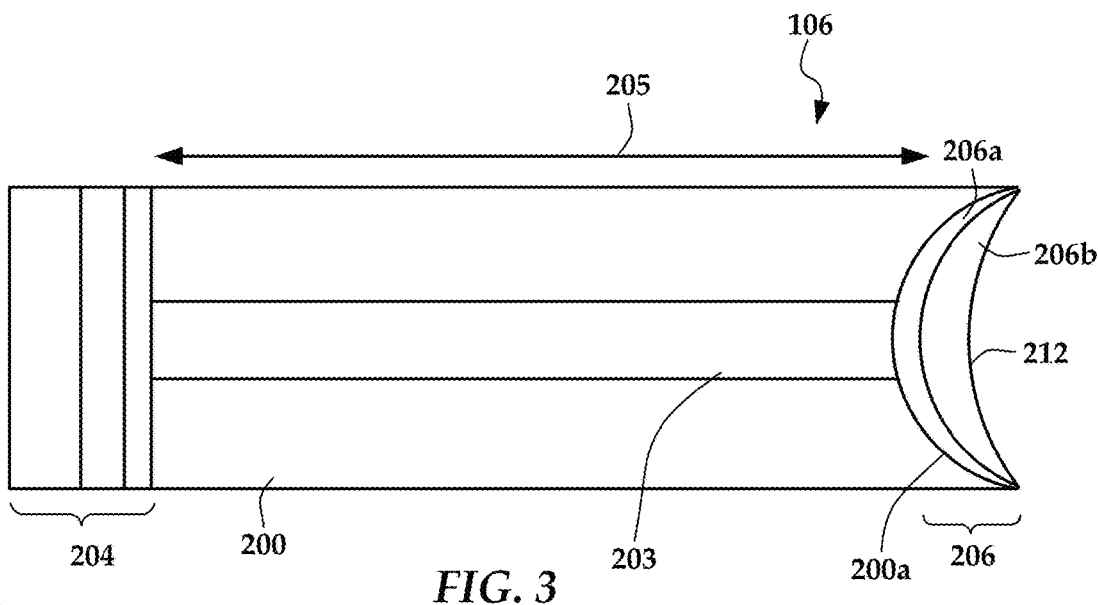
FIGS. 3 and 4 are top views of laser diodes according to example embodiments.

This disclosure describes a laser diode that include beam shaping features that improve optical transmission in the recording head. In FIGS. 2 and 3, perspective and top views show details of a laser diode 201 according to an example embodiment, which may be used as lasers 102, 122 in the embodiments shown in FIGS. 1A and 1B. The laser diode 201 includes a body 200 that is formed of various material layers. Generally, the layers have material composition and geometry that forms an active region 202 (also referred to as a quantum well, cavity) in which lasing occurs. A ridge 203 protruding from the body 200 acts as a waveguide that shapes the light within the active region 202. While examples and simulations below may pertain to a ridge laser, the concepts below (e.g., curved front facet) may be applicable to other types of lasers, such as broad area laser. The body 200 is capped on both ends by a rear facet 204 and a front facet 206, separated by cavity length 205. Both facets 204, 206 may be reflective, and the reflectivity is configure such that laser light emits out the front facet 206 once it has achieved sufficient intensity. The facets 204, 206 are formed integrally with the laser 201, e.g., formed together with the body 200 and other components via a layer deposition and photolithography type process. The integral curved facet 206 may generally have different performance than an externally-mounted lens or other optical shaping device.

The shape of the beam that the semiconductor 201 emits may be dictated by the shape of the laser ridge 202 and epitaxial stack structure surrounding the ridge 202. These structures are adjusted to optimize the performance and efficiency of the laser may not significantly affect the resultant beam shape after it exits the front facet 206. A general-purpose laser diode may have a planar front facet, as indicated by lines 210, which is relatively easy to manufacture and behaves predictably.

In the illustrated laser diode 201, the front facet 206 includes a curved exterior surface 212 that can be configured to modify the emitted beam shape without changing the ridge shape or epitaxial stack. The curved surface 212 may be circular, parabolic, elliptical, hyperbolic, or a piecewise linear approximation of any of these curves. The layers that form the front facet 206 may also be curved, as is a front part 200a of the body 200. In other embodiments, the inside facing surfaces of the front facet may be curved differently, e.g., different radius of curvature convex, curved in alternate directions (e.g., vertically instead of horizontally as shown), curved in two-dimensions, piecewise linear curve approximations, etc.

The front facet 206 may be formed of multiple material layers, e.g., layers 206a and 206b. These layers 206a-b may be selected to have specific optical properties, e.g., specific difference in indices of refraction. For example, layer 206a may be formed of $Si_3N_4$ and layer 206b may be formed of $SiO_2$. The number of layers 206a-b may vary. In some embodiments, a maximum of four layers could be used, and in other embodiments more or fewer layers may be used. The rear facet 204 may be formed of similar materials, as well as including additional layer, e.g., metallic reflective layer of Au, Ag, etc. The rear facet 204 may use similar or different dielectric material combination as the front facet. The number of rear facet coating layers might be different than the front facet.

By using a curved front facet 206, the beam shape can be adjusted to be any shape from near circular to highly elliptical and all intermediate variations. Being able to influence the beam shape can be helpful in improving the coupling efficiency between a laser and an optical coupler. Reshaping the beam can create a better match between the actual beam shape and the shape of the beam which the coupler will accept. It is also possible to influence the divergence angle of the laser beam which allows the separation between laser and coupler to be increased relative to a similar laser with a planar facet (or a smaller dimension coupler to be used relative to what would be used for a laser with a planar facet). Ability to increase the separation between laser and coupler is an advantage when it comes to improving the manufacturability of laser coupling optical systems.

Figure 4:
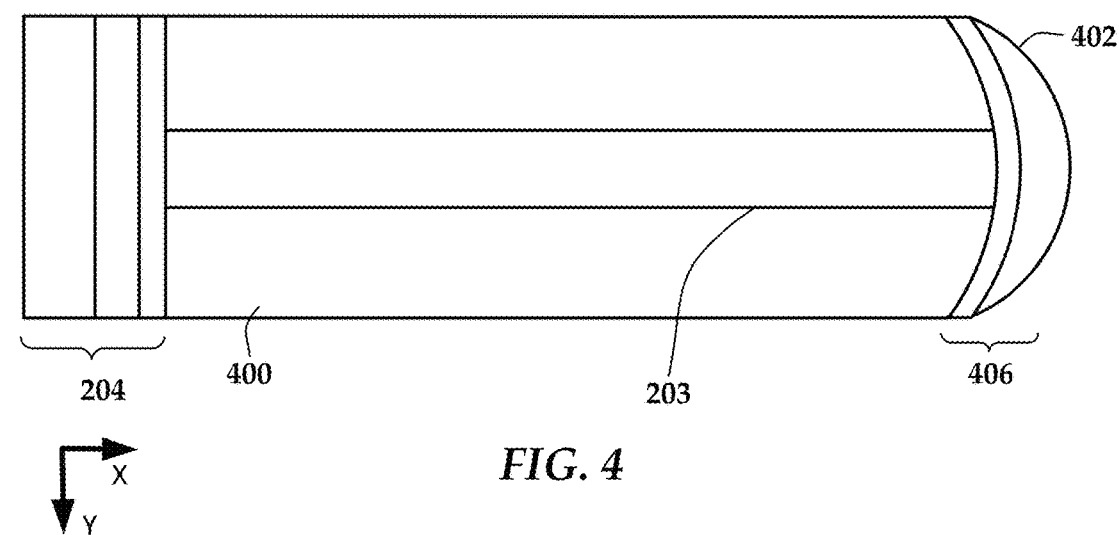

In FIG. 4, a top view shows details of a laser diode according to another example embodiment. For convenience, some components in FIG. 4 are given the same reference number as similar components shown in FIGS. 2 and 3. In this example, the body 400 and front facet 402 are configured with a convex front surface 404. This will result in a significantly different shaping of the output beam compared to the concave front surface 212 shown in FIG. 3.

Figure 5:
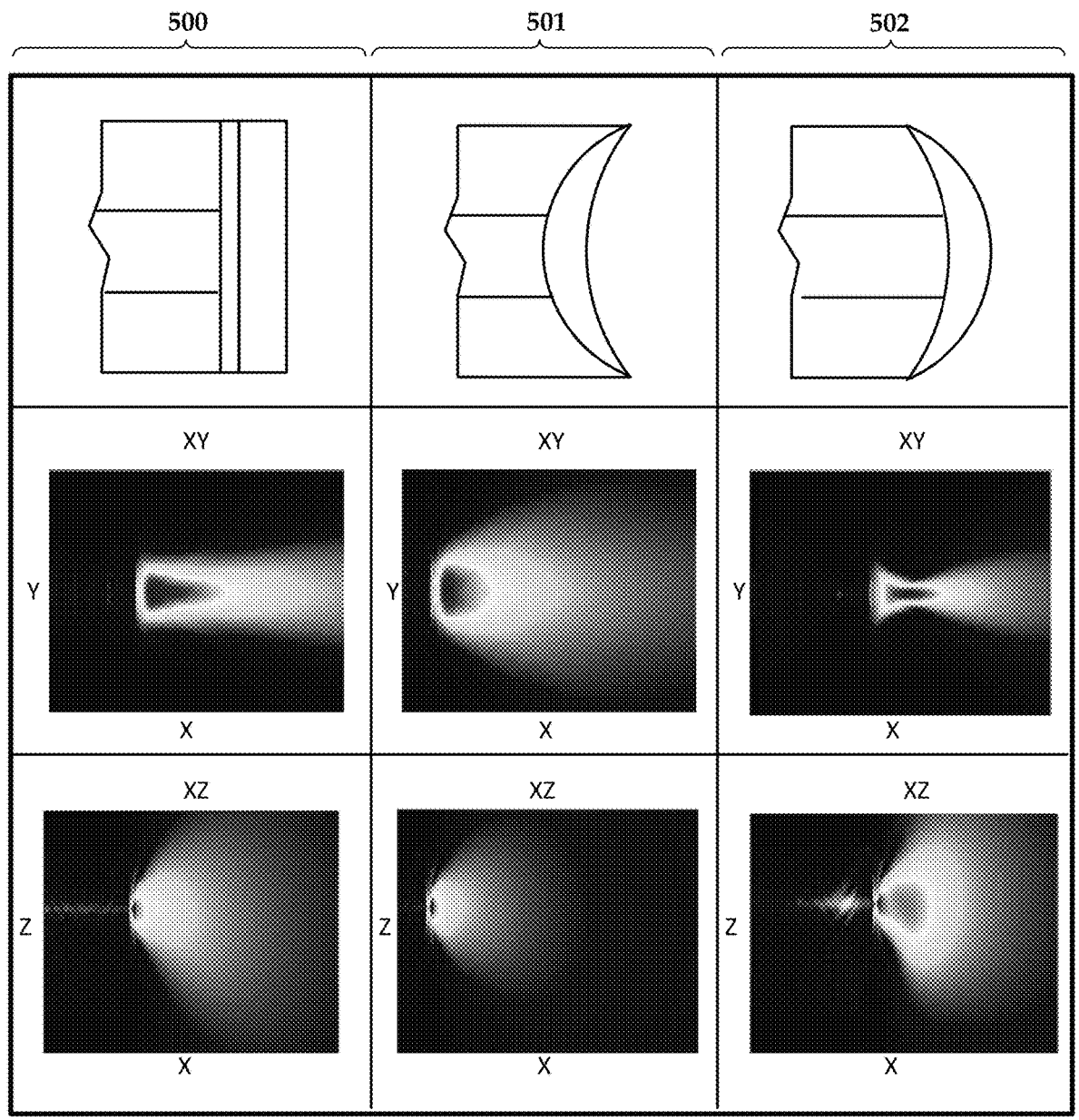
FIGS. 5 and 6 are field intensity plots showing simulated performance of lasers according to example embodiments
Figure 6:
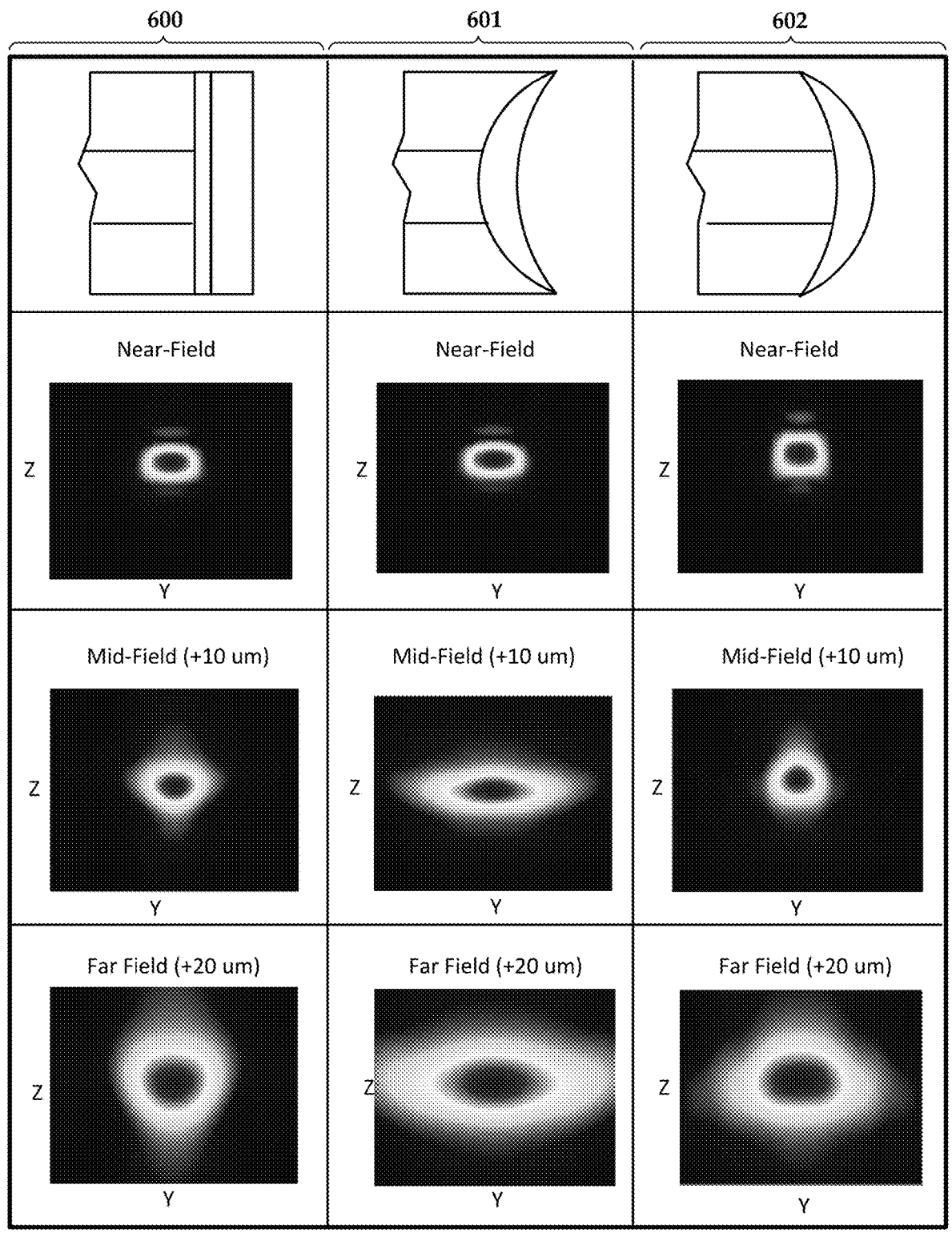

In FIGS. 5 and 6, simulation results of various laser facet shapes are shown. The top row of each column in FIG. 5 generally indicates three facet geometries that were analyzed, planar 500, concave 501 and convex 502, the latter being modeled as parabolic curves for purposes of these simulations. The plots are field magnitude showing the shape of the output beam in the xy-plane (middle row in FIG. 5) and xz-plane (bottom row in FIG. 5). The coordinate system referenced in the plots of FIG. 5 is shown in FIGS. 2-4.

The top row of each column in FIG. 6 generally indicates the same three facet geometries of FIG. 5, namely planar 600, concave 601 and convex 602. The plots are field magnitudes that indicate the shape of the output beam in the yz-plane at the near-field region (second row in FIG. 6), mid-field region (third row in FIG. 6) and far-field region (bottom row in FIG. 6). The different field shapes of the concave 602 and convex 604 laser facets can be tailored to match an input coupler on a read/write head.

Figure 7:
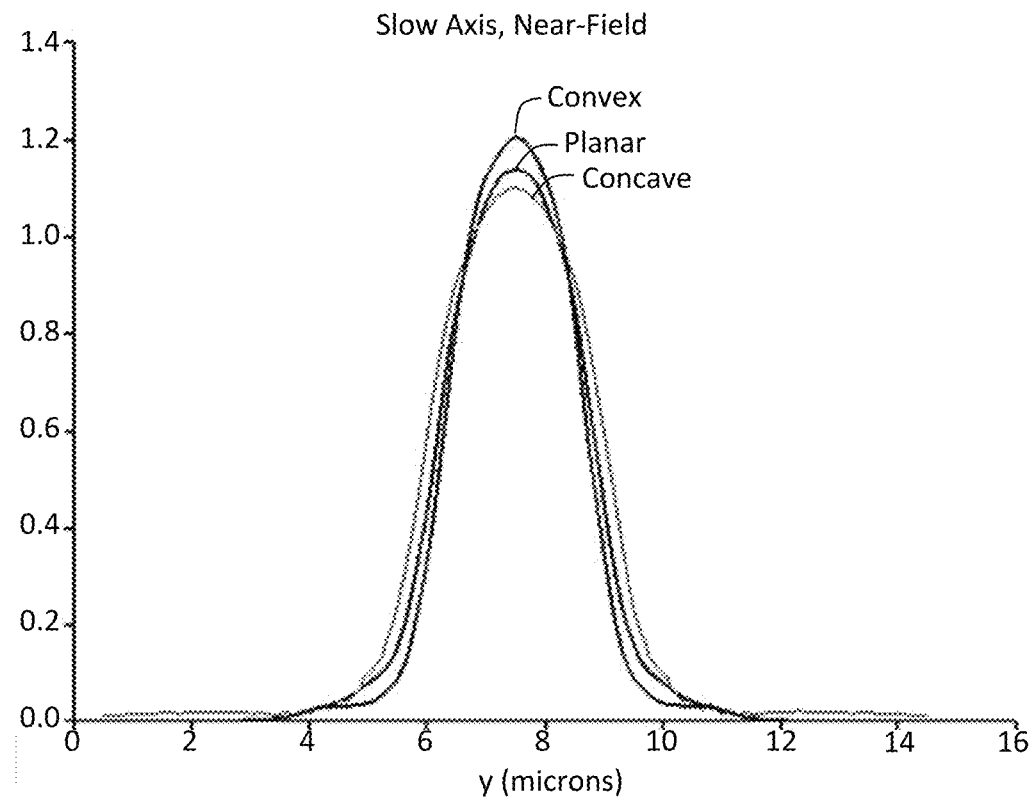
FIGS. 7-10 are graphs showing additional simulation results of lasers according to example embodiments.
Figure 8:
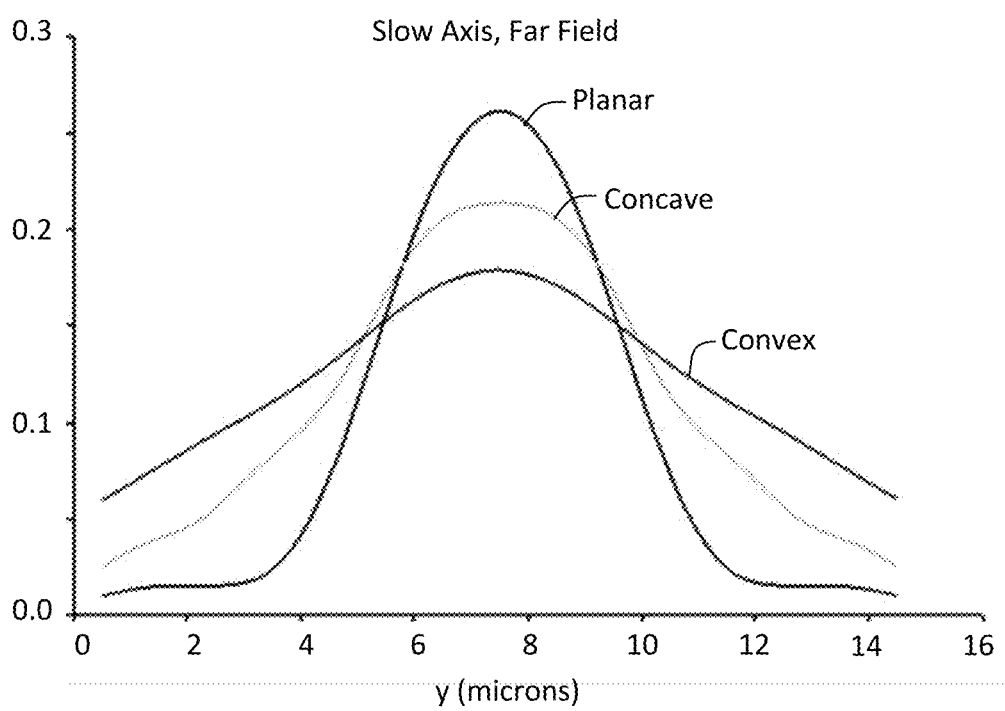
Figure 9:
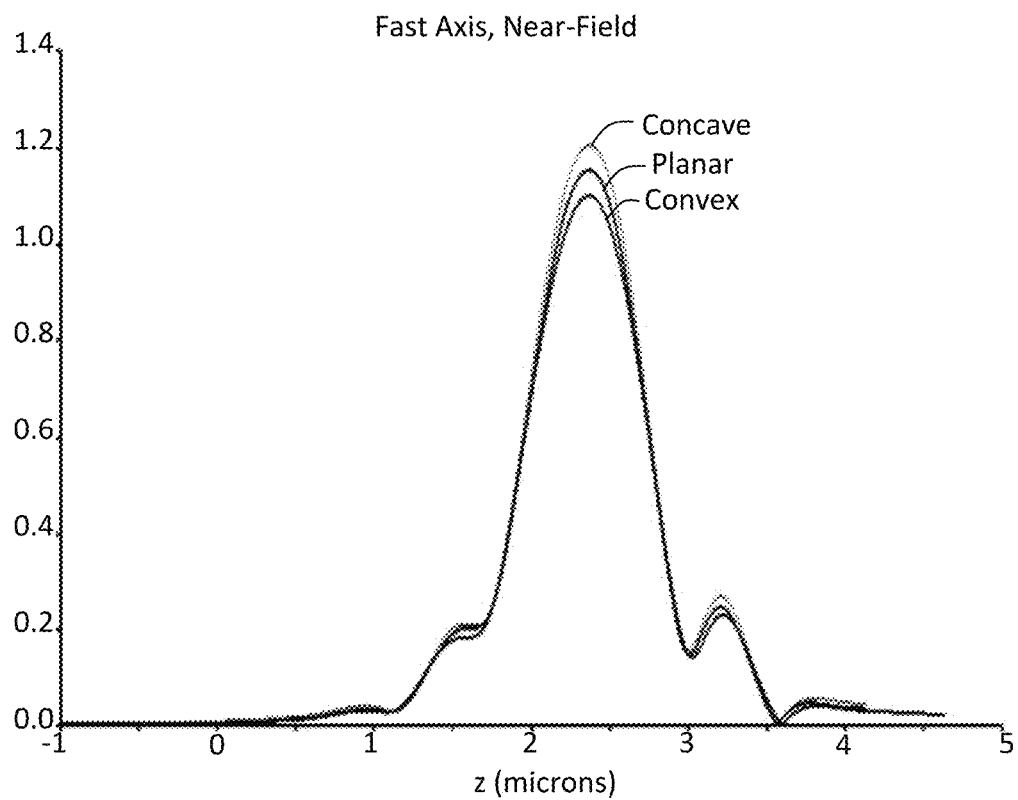
Figure 10:
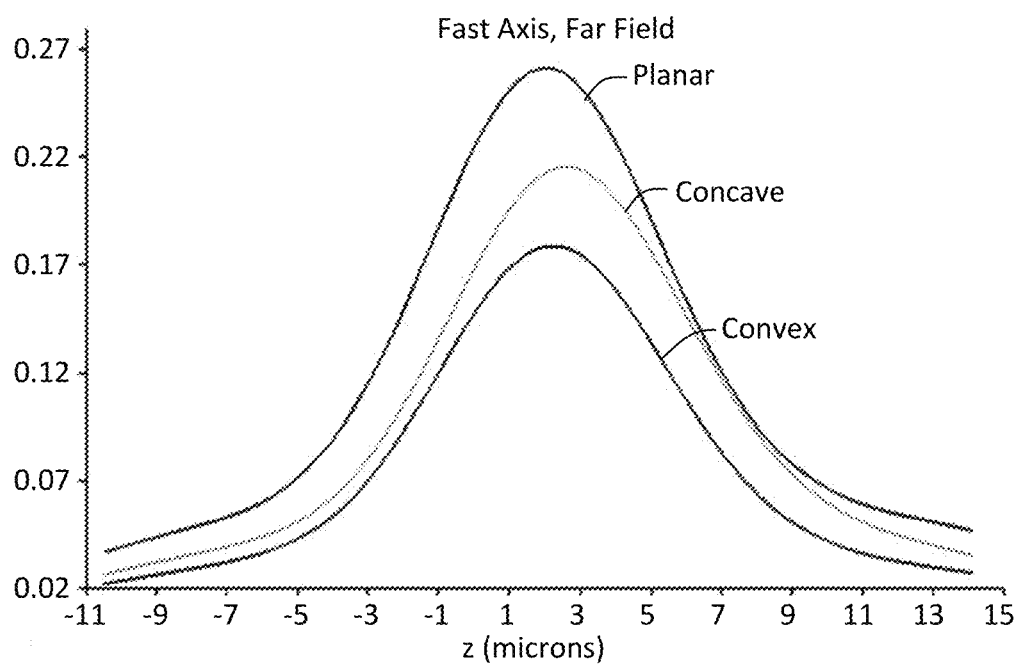

In FIGS. 7-10, graphs show the comparative performance of planar, convex, and concave lasers according to an example embodiment. The graphs in FIGS. 7 and 8 are respectively near-field and far-field magnitude values along the slow axis of the laser (y-direction). The graphs in FIGS. 9 and 10 are respectively near-field and far-field magnitude values along the fast axis of the laser (z-direction). In Tables 1 and 2 below, additional metrics associated with these plots are summarized.

TABLE 1

| Facet | Fast Axis Far Field Angle | Slow Axis Far Field Angle | Fast Axis FWHM @ 0 um | Slow Axis FWHM @ 0 um |
|---|---|---|---|---|
| Planar | 14° | 3° | 0.8 | 2.7 |
| Convex | 13° | 12° | 0.8 | 3.1 |
| Concave | 15° | 7° | 0.9 | 2.5 |

TABLE 2

| Facet | Fast Axis FWHM @ 10 um | Slow Axis FWHM @ 10 um | Fast Axis FWHM @ 20 um | Slow Axis FWHM @ 20 um |
|---|---|---|---|---|
| Planar | 4.8 | 3.2 | 9.3 | 4.6 |
| Convex | 4.7 | 6.6 | 8.9 | 10.6 |
| Concave | 4.9 | 2.5 | 9.1 | 6.2 |

Figure 11:
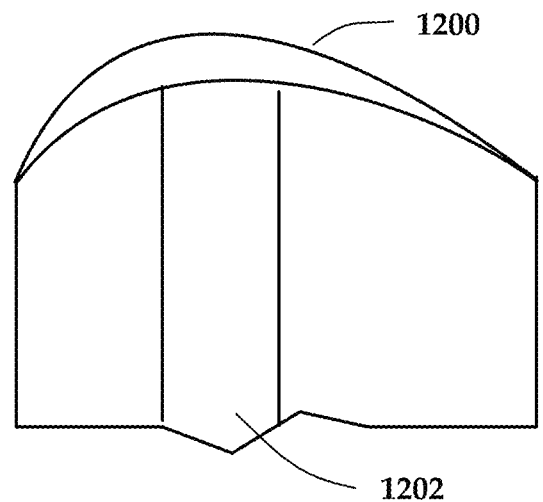
FIGS. 11 and 12 are views of curved laser facets according to other example embodiments.
Figure 12:
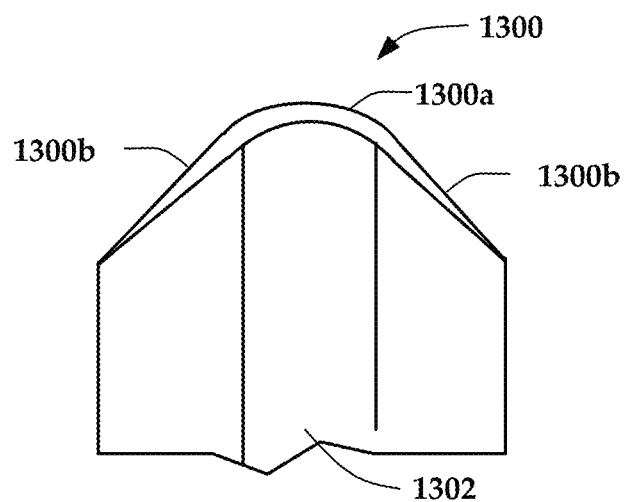

Note than any of the embodiments described herein may use an asymmetric curved facet, e.g., a symmetric or asymmetric curve that is centered or shifted relative to the center of the laser body. In FIG. 11, a diagram shows a front facet 1200 that is non-symmetric and shifted to one side. This non-symmetric shape may be used, as shown here, to place an apex of the curved facet over an off center ridge 1202 of the laser. In FIG. 12, a curved facet 1300 is shown that uses two different types of curves. A curved portion 1300a is centered over ridge 1302 and joined by linear portions 1300b on either side. In some embodiments, e.g., where the curves are formed by successive deposition of materials, the curves may be piecewise linear approximations to reduce the number of manufacturing steps.

Figure 13:
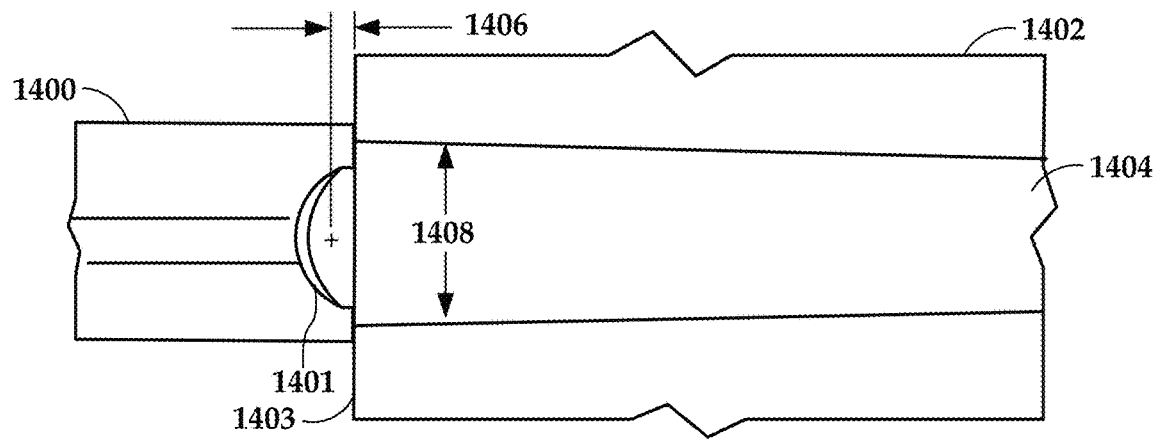
FIG. 13 is a diagram showing a laser interfacing with a recording head according to an example embodiment.

Generally, a curved front laser facet will be designed to interface with a target waveguide within a HAMR read/write head. An example of this is shown in the diagram of FIG. 13. A laser diode 1400 is shown abutted against an outer surface 1403 of a slider body 1402. The slider body 1402 includes an input coupler 1404 that receives light emitted from the laser 1400. The input coupler 1404 is formed of materials and has geometry designed to efficiently receive light from the laser 1400 and deliver it to a waveguide (not shown) which extends to the write transducer. The laser 1400 includes a curved facet 1401 that is designed to effectively couple emitted light with particular geometry of the input coupler 1404 and the relative orientation of the laser 1400 to the input coupler 1404.

As shown in FIG. 13, there is a separation distance 1406 between the laser facet 1401 and the surface 1403 of the slider body 1402. This distance 1406 can be affected by manufacturing tolerances, thermal expansion, etc., and may be around 1.5 µm to 2.5 µm in one embodiment. The input coupler 1404 has a width 1408 that, in this illustration, is wider than that of the facet 1401. Increasing the width 1408 may reduce loss of efficiency due to misalignment between the laser 1400 and the slider 1402, although may provide less efficient coupling in cases where the alignment is good between the laser 1400 and slider 1402. The input coupler 1404 may have other features, such as gradient index layers, that can compensate for alignment errors. Generally, the curved facet 1401 can also be designed together with the input coupler 1404 to reduce sensitivity to misalignments, while maintaining good coupling efficiency.

Figure 14:
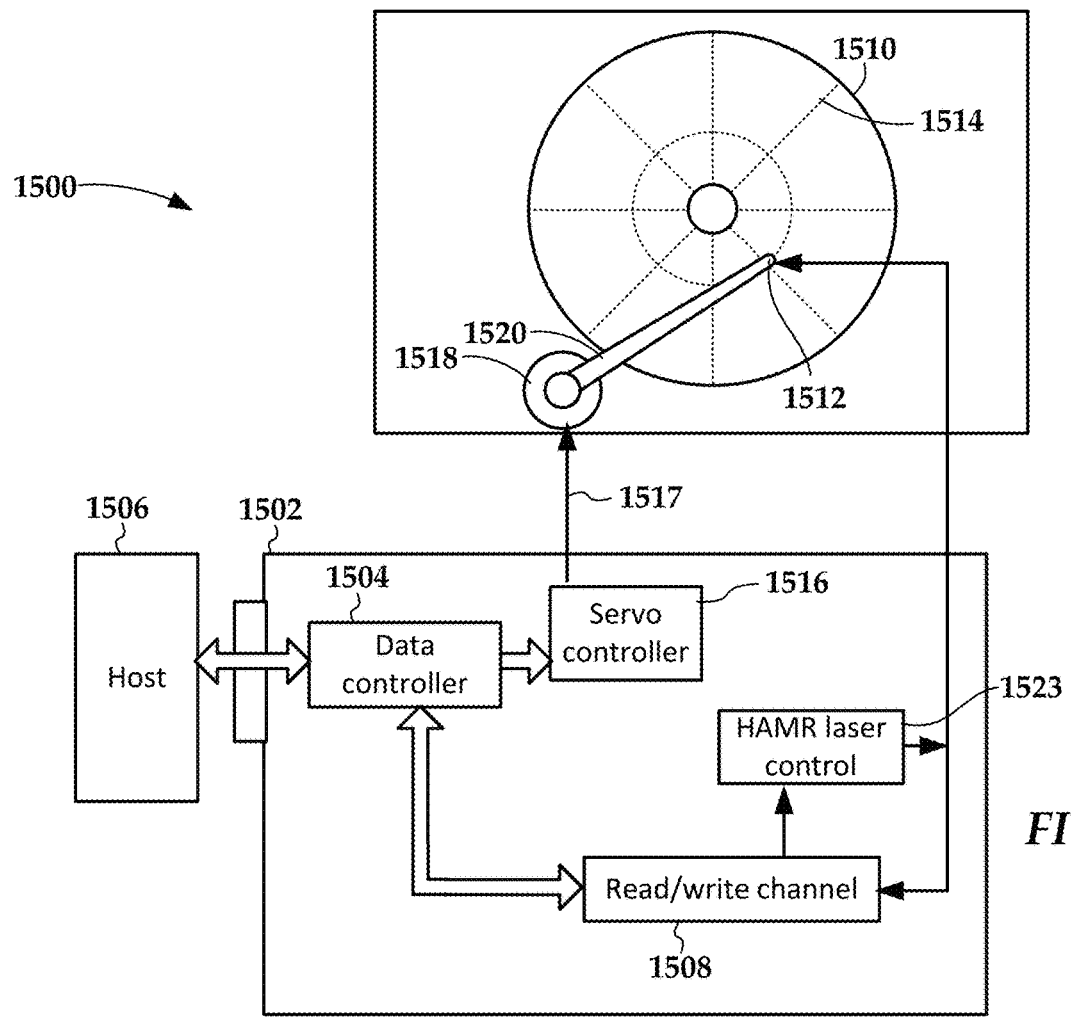
FIG. 14 is a block diagram of an apparatus according to an example embodiment.

As noted above, a laser diode with a curved facet can be used for recording in a HAMR data storage apparatus. In FIG. 14, a block diagram illustrates a data storage apparatus 1500 according to an example embodiment. Control logic circuit 1502 of the apparatus 1500 includes a system controller 1504 that processes read and write commands and associated data from a host device 1506. The host device 1506 may include any electronic device that can be communicatively coupled to store and retrieve data from a data storage device, e.g., a computer, peripheral card, etc. The system controller 1504 is coupled to a read/write channel 1508 that reads from and writes to a surface of a recording medium, e.g., one or more magnetic disks 1510.

Figure 15:
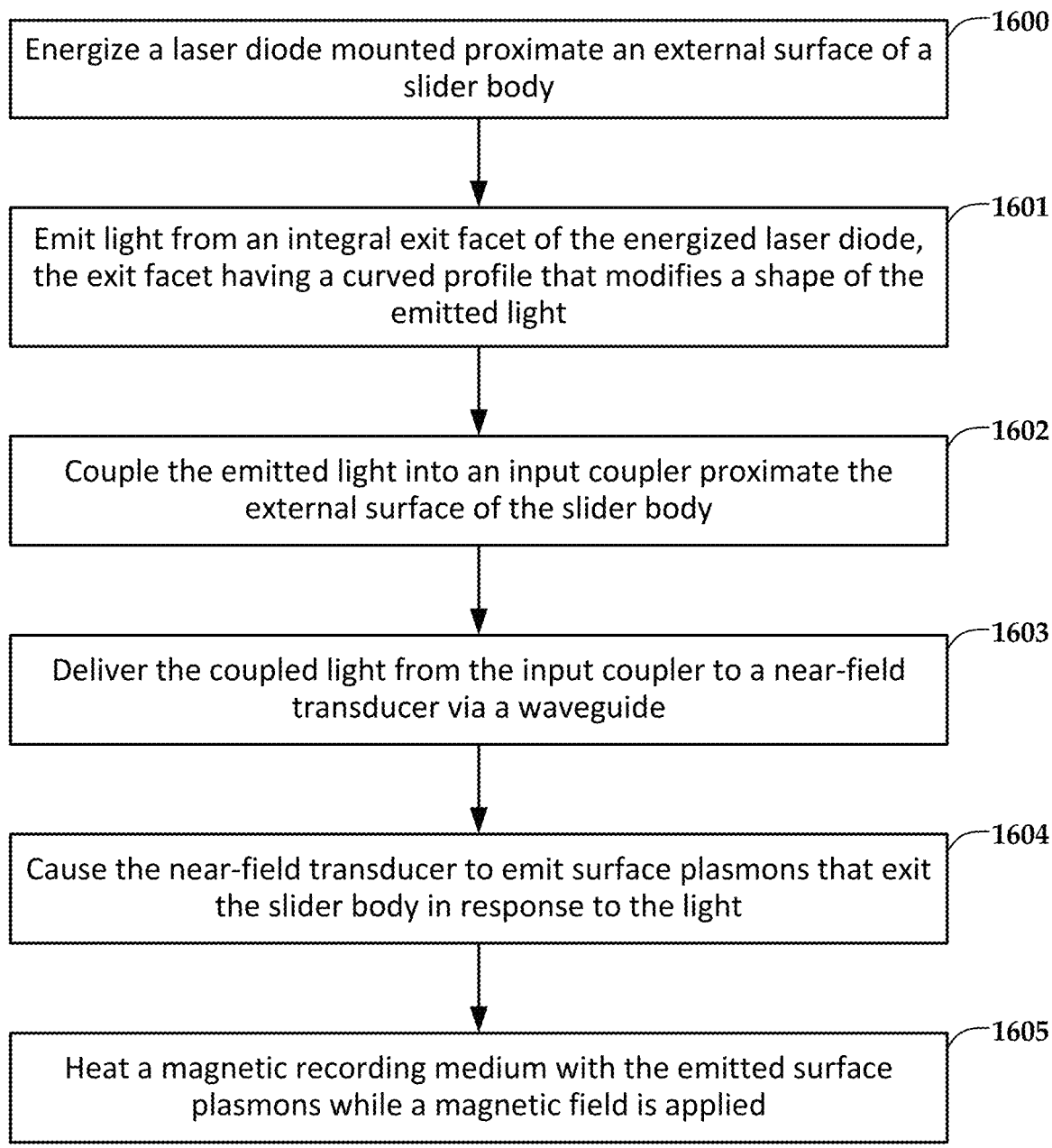
FIG. 15 is a flowchart of a method according to an example embodiment.

The read/write channel 1508 generally converts data between the digital signals processed by the controller 1504 and the analog signals conducted through one or more read/write heads 1512 during read operations. To facilitate the read operations, the read/write channel 1508 may include analog and digital circuitry such as preamplifiers, filters, decoders, digital-to-analog converters, timing-correction units, etc. The read/write channel 1508 also provides servo data read from servo wedges 1514 on the magnetic disk 1510 to a servo controller 1516. The servo controller 1516 uses these signals to provide a voice coil motor control signal 1517 to a VCM 1518. The VCM 1518 moves (e.g., rotates) an arm 1520 upon which the read/write heads 1512 are mounted in response to the voice coil motor control signal 1517. The disk drive 1500 uses HAMR, and therefore the read/write heads 1512 include an energy source (e.g., laser diode) that heats the magnetic disk 1510 when recording. A HAMR laser control block 1523 applies a current to activate the lasers when recording. The activated lasers heat the recording medium 1510, and magnetic writers on the read/write heads 1510 are also activated together with the lasers to write pattern of magnetic fields to the recording medium In FIG. 15, a flowchart shows a method according to an example embodiment. The method involves energizing 1600 a laser diode mounted proximate an external surface of a slider body. The energized laser diode emits 1601 light from an integral exit facet having a curved profile that modifies a shape of the light emitted from the exit facet. The emitted light is coupled 1602 into an input coupler proximate the external surface of the slider body. The coupled light from the input coupler is delivered 1603 to a near-field transducer via a waveguide. The light causes the near-field transducer to emit 1604 surface plasmons that exit the slider body. A magnetic recording medium with is heated 1605 with the emitted surface plasmons while a magnetic field is applied.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative.

What is claimed is:

1. A heat-assisted magnetic recording head, comprising:
   a slider body having a waveguide that delivers light to a near-field transducer, the waveguide optically coupled to an input coupler of the slider body that receives the light; and
   a laser diode mounted on or in the slider body, the laser diode comprising an integral exit facet at an end of the laser diode, the exit facet proximate an input surface of the input coupler, the exit facet having a curved profile that modifies a shape of the light emitted from the exit facet into the input coupler, the curved profile extending from side-to-side across a width of the laser diode such that no part of the end of the laser diode is flat against the input surface.

2. The heat-assisted magnetic recording head of claim 1, wherein the curved profile comprises a piecewise linear approximation of a convex profile.

3. The heat-assisted magnetic recording head of claim 1, wherein the curved profile comprises a piecewise linear approximation of a concave profile.

4. The heat-assisted magnetic recording head of claim 1, wherein the curved profile comprises a hyperbolic curve.

5. The heat-assisted magnetic recording head of claim 1, wherein curved profile comprises linear edges that are joined to a convex curve, the linear edges extending smoothly and tangentially from the convex curve to sides of the laser diode.

6. The heat-assisted magnetic recording head of claim 1, wherein the curved profile is asymmetric and shifted relative to a center of the laser diode.

7. The heat-assisted magnetic recording head of claim 1, wherein the curved profile influences a divergence angle of the light which allows a separation between the laser diode and the input coupler to be increased relative to a planar exit facet, wherein the separation is between 1.5 µm to 2.5 µm.

8. The heat-assisted magnetic recording head of claim 1, wherein the curved profile influences a divergence angle of the light which allows the input coupler to have a smaller dimension near the external surface relative to a laser with a planar exit facet, wherein the smaller dimension is less than a width of the laser diode.

9. A heat-assisted magnetic recording head, comprising:
   a slider body having a waveguide that delivers light to a near-field transducer, the waveguide optically coupled to an input coupler of the slider body that receives the light; and
   a laser diode mounted proximate the input coupler of the slider body, the laser diode emitting light from an integral exit facet having an outer curved profile that modifies a shape of the light emitted from the exit facet, wherein an inside facing surface of a coating layer on the exit facet is curved differently than the outer curved profile.

10. The heat-assisted magnetic recording head of claim 9, wherein the outer curved profile comprises a piecewise linear approximation of a convex profile.

11. The heat-assisted magnetic recording head of claim 9, wherein the outer curved profile comprises a piecewise linear approximation of a concave profile.

12. The heat-assisted magnetic recording head of claim 9, wherein the outer curved profile comprises hyperbolic curve.

13. The heat-assisted magnetic recording head of claim 9, wherein outer curved profile comprises linear edges that are joined to a convex curve, the linear edges extending smoothly and tangentially from the convex curve to sides of the laser diode.

14. The heat-assisted magnetic recording head of claim 9, wherein the outer curved profile is asymmetric and shifted relative to a center of the laser diode.

15. The heat-assisted magnetic recording head of claim 9, wherein the outer curved profile influences a divergence angle of the light which allows a separation between the laser diode and the input coupler to be increased relative to a planar exit facet, wherein the separation is between 1.5 µm to 2.5 µm.

16. The heat-assisted magnetic recording head of claim 9, wherein the outer curved profile influences a divergence angle of the light which allows the input coupler to have a smaller dimension near the external surface relative to a laser with a planar exit facet, wherein the smaller dimension is less than a width of the laser diode.

17. The heat-assisted magnetic recording head of claim 1, wherein an inside facing surface of a coating layer on the exit facet is curved differently than the curved profile.

18. The heat-assisted magnetic recording head of claim 17, wherein the inside facing surface has a different radius of curvature than the curved profile.

19. The heat-assisted magnetic recording head of claim 9, wherein the inside facing surface has a different radius of curvature than the outer curved profile.

20. The heat-assisted magnetic recording head of claim 9, wherein the outer curved profile extends from side-to-side across a width of the laser diode such that no part of the end of the laser diode is flat against the input surface.

* * * * *